United States Patent
Choi et al.

(10) Patent No.: US 12,207,394 B2
(45) Date of Patent: Jan. 21, 2025

(54) CIRCUIT BOARD, ANTENNA PACKAGE AND DISPLAY DEVICE

(71) Applicants: DONGWOO FINE-CHEM CO., LTD., Jeollabuk-do (KR); POSTECH RESEARCH AND BUSINESS DEVELOPMENT FOUNDATION, Gyeongsangbuk-do (KR)

(72) Inventors: Byung Jin Choi, Incheon (KR); Young Ju Kim, Gyeonggi-do (KR); Dong Pil Park, Incheon (KR); Won Bin Hong, Seoul (KR)

(73) Assignees: DONGWOO FINE-CHEM CO., LTD., Jeollabuk-Do (KR); POSTECH RESEARCH AND BUSINESS DEVELOPMENT FOUNDATION, Gyeongsangbuk-Do (KR)

( * ) Notice: Subject to any disclaimer, the term of this patent is extended or adjusted under 35 U.S.C. 154(b) by 179 days.

(21) Appl. No.: 18/114,677

(22) Filed: Feb. 27, 2023

(65) Prior Publication Data
US 2023/0225046 A1    Jul. 13, 2023

Related U.S. Application Data

(63) Continuation of application No. PCT/KR2021/011437, filed on Aug. 26, 2021.

(30) Foreign Application Priority Data

Aug. 28, 2020 (KR) .................. 10-2020-0109675

(51) Int. Cl.
*H05K 1/02* (2006.01)
*H01Q 1/24* (2006.01)
*H01Q 1/38* (2006.01)

(52) U.S. Cl.
CPC .......... *H05K 1/0243* (2013.01); *H01Q 1/243* (2013.01); *H01Q 1/38* (2013.01); *H05K 2201/10098* (2013.01); *H05K 2201/10128* (2013.01)

(58) Field of Classification Search
None
See application file for complete search history.

(56) References Cited

U.S. PATENT DOCUMENTS

| | | | | |
|---|---|---|---|---|
| 5,581,268 A | * | 12/1996 | Hirshfield | .............. H01Q 11/08 343/895 |
| 2013/0307746 A1 | * | 11/2013 | Nakano | .............. G06K 7/10178 343/866 |

(Continued)

FOREIGN PATENT DOCUMENTS

| | | |
|---|---|---|
| CN | 216563547 U | 5/2022 |
| JP | 2018-148290 A | 9/2018 |

(Continued)

OTHER PUBLICATIONS

International Search Report for PCT/KR2021/011437 mailed on Dec. 3, 2021.

*Primary Examiner* — Krystal Robinson
(74) *Attorney, Agent, or Firm* — The PL Law Group, PLLC

(57) ABSTRACT

A circuit board according to an embodiment includes a core layer including a first region and a second region, and antenna power supply wirings disposed on the core layer over the first region and the second region. The antenna power supply wirings may include a first portion extending in a first direction in the first region, a second portion extending in a second direction in the first region, and a third portion extending in the first direction in the second region, and an interval between the neighboring second portions of the antenna power supply wirings is 3 times or less of an (Continued)

interval between the neighboring third portions of the antenna power supply wirings.

8 Claims, 4 Drawing Sheets

(56) References Cited

U.S. PATENT DOCUMENTS

| | | | | |
|---|---|---|---|---|
| 2013/0329382 | A1* | 12/2013 | Jung | ........................ H05K 7/06 |
| | | | | 174/251 |
| 2014/0300849 | A1* | 10/2014 | Jung | .................... H01L 23/4985 |
| | | | | 257/774 |
| 2016/0254590 | A1* | 9/2016 | Seo | ........................ H04B 1/006 |
| | | | | 343/876 |
| 2017/0069958 | A1* | 3/2017 | Ko | ............................ H01Q 1/38 |
| 2020/0227835 | A1 | 7/2020 | Kim et al. | |
| 2020/0251825 | A1 | 8/2020 | Kim et al. | |

FOREIGN PATENT DOCUMENTS

| | | |
|---|---|---|
| KR | 10-2016-0029311 A | 3/2016 |
| KR | 10-2019-0019802 A | 2/2019 |
| KR | 10-2019-0074569 A | 6/2019 |
| KR | 10-2019-0089515 A | 7/2019 |
| KR | 10-2020-0005364 A | 1/2020 |
| KR | 10-2091739 B1 | 3/2020 |
| KR | 10-2020-0039321 A | 4/2020 |

\* cited by examiner

CIRCUIT BOARD, ANTENNA PACKAGE AND DISPLAY DEVICE

CROSS-REFERENCE TO RELATED APPLICATION AND CLAIM OF PRIORITY

This application is a continuation application to International Application No. PCT/KR2021/011437 with an International Filing Date of Aug. 26, 2021, which claims the benefit of Korean Patent Application No. 10-2020-0109675 filed on Aug. 28, 2020, in the Korean Intellectual Property Office (KIPO), the entire disclosure of which is incorporated by reference herein.

BACKGROUND

1. Field

The present invention relates to a circuit board, an antenna package and a display device including the same.

2. Description of the Related Art

Recently, according to development of the information-oriented society, wireless communication techniques such as Wi-Fi, Bluetooth, and the like are implemented, for example, in a form of smartphones by combining with display devices. In this case, an antenna may be coupled to the display device to perform a communication function.

Recently, with mobile communication techniques becoming more advanced, it is necessary for an antenna for performing communication in high frequency or ultra high frequency bands corresponding to, for example, 3G to 5G to be coupled to the display device.

In order to radiation drive the antenna, a circuit board for supplying a power, transmitting control signals, and the like may be connected to the antenna. For example, in order to connect with an antenna driving circuit, the circuit board may be bent, and in this case, a damage to the wiring of the circuit board, an adhesion failure with the antenna due to bending stress, and the like may be caused.

Meanwhile, in recent years, a thickness of the display device to which the antenna is coupled has been decreased, and an area of the bezel part of the display device has been reduced. Accordingly, it is necessary to design a circuit board and an antenna package, which can ensure reliability in bonding of the circuit board and circuit connection and allow the antenna to be coupled therewith even if the bezel part has a small area, while maintaining or improving radiation characteristics of the antenna.

SUMMARY

It is an object of the present invention to provide a circuit board, an antenna package and a display device including the same.

To achieve the above objects, the following technical solutions are adopted in the present invention.

1. A circuit board including: a core layer which includes a first region and a second region; and antenna power supply wirings disposed on the core layer over the first region and the second region, wherein the antenna power supply wirings include a first portion extending in a first direction in the first region, a second portion extending in a second direction in the first region, and a third portion extending in the first direction in the second region, and an interval between the neighboring second portions of the antenna power supply wirings is 3 times or less of an interval between the neighboring third portions of the antenna power supply wirings.

2. The circuit board according to the above 1, wherein the interval between the neighboring second portions of the antenna power supply wirings is 0.5 times or more of the interval between the neighboring third portions of the antenna power supply wirings.

3. The circuit board according to the above 1, wherein the interval between the neighboring third portions of the antenna power supply wirings is 0.05 mm or more and 1 mm or less.

4. The circuit board according to the above 1, wherein the interval between the neighboring third portions of the antenna power supply wirings is 0.1 mm or more and 0.7 mm or less.

5. The circuit board according to the above 1, wherein the first region includes an antenna region to which antenna units and the antenna power supply wirings are connected, and the second region includes an antenna driving unit region to which an antenna driving unit and the antenna power supply wirings are connected.

6. The circuit board according to the above 1, wherein the antenna power supply wirings are formed to have substantially the same length as each other.

7. The circuit board according to the above 6, wherein the antenna power supply wirings are formed so that a gain deviation of antenna units connected to the antenna power supply wirings is below 1 dBi or a phase delay difference of the antenna power supply wirings is below 10 degrees.

8. An antenna package including: the circuit board according to the above 1; and antenna units connected to the antenna power supply wirings of the circuit board.

9. A display device including the antenna package according to the above 8.

According to an embodiment, the circuit board may include the core layer including the first region and the second region, and the antenna power supply wirings disposed on the core layer over the first region and the second region. In this case, the antenna power supply wirings may be formed so that an interval in the first direction in the first region is below a predetermined multiple of an interval in the second direction in the second region.

Accordingly, an independence of the electrical signals applied to each antenna unit may be maintained to prevent signal disturbance between the antenna power supply wirings, and a length of the first region of the circuit board in the first direction may be reduced. Thereby, even if the light-shielding part or the bezel part formed on the front portion of the display device has a small area, it is possible to easily couple the antenna package including the circuit board to the display device.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION

Figure 1:
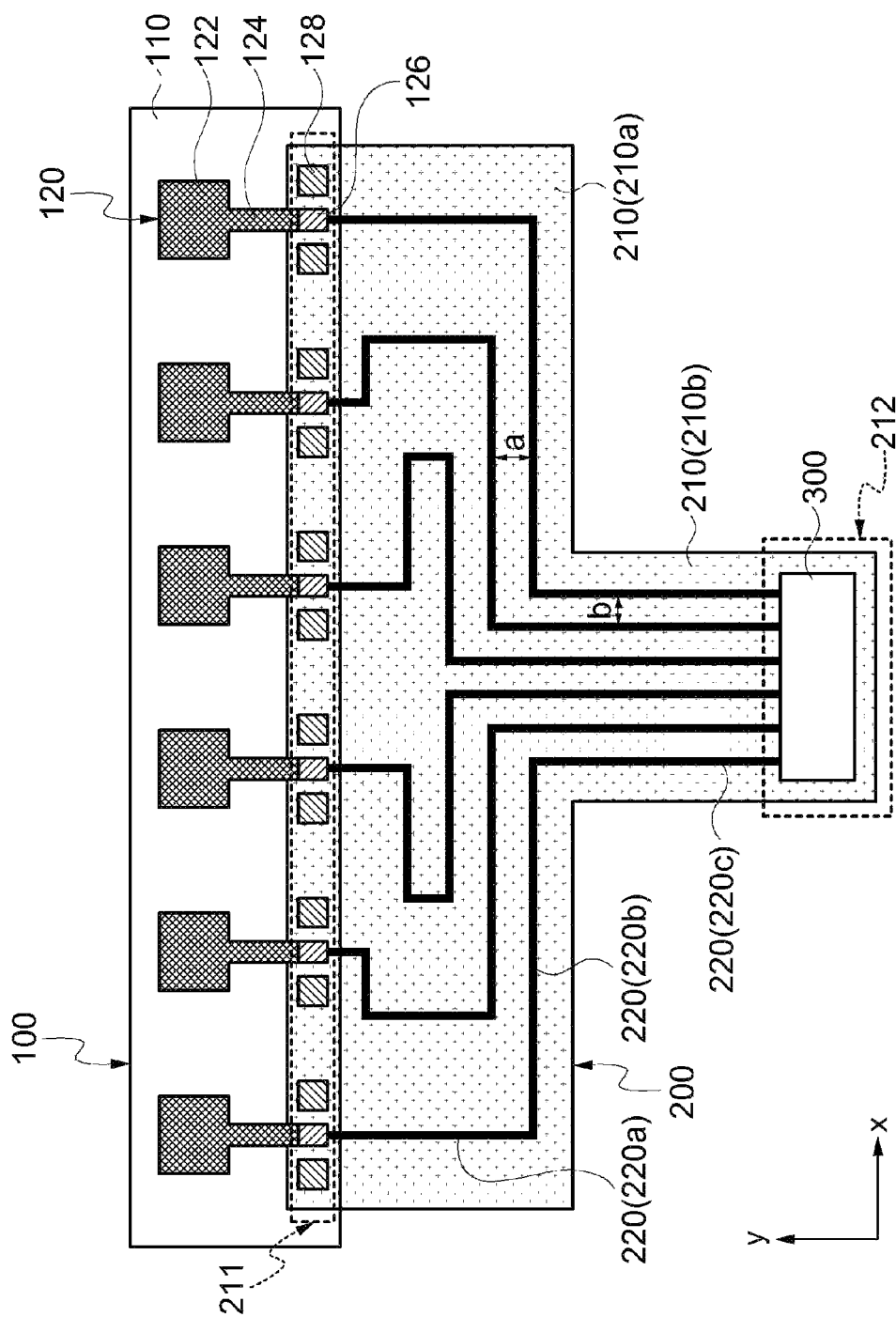
FIG. 1 is a schematic plan view illustrating an antenna package according to an embodiment.

Hereinafter, preferred embodiments of the present invention will be described in detail with reference to the accompanying drawings. However, since the drawings attached to the present disclosure are only given for illustrating one of preferable various embodiments of present invention to easily understand the technical spirit of the present invention with the above-described invention, it should not be construed as limited to such a description illustrated in the drawings.

It will be understood that, although the terms first, second, etc. may be used herein to describe various elements or components, these elements or components should not be limited by these terms. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, components and/or a combination thereof, but do not preclude the presence or addition of one or more other features, integers, steps, operations, elements, components, and/or a combination thereof.

Further, directional terms such as "one side," "the other side," "upper," "lower," "upper surface," "lower surface," "first direction," "second direction," and the like are used in connection with the orientation of the disclosed drawings. Since the elements or components of the embodiments of the present invention may be located in various orientations, the directional terms are used for illustrative purposes, and are not intended to limit the present invention thereto.

Figure 2:
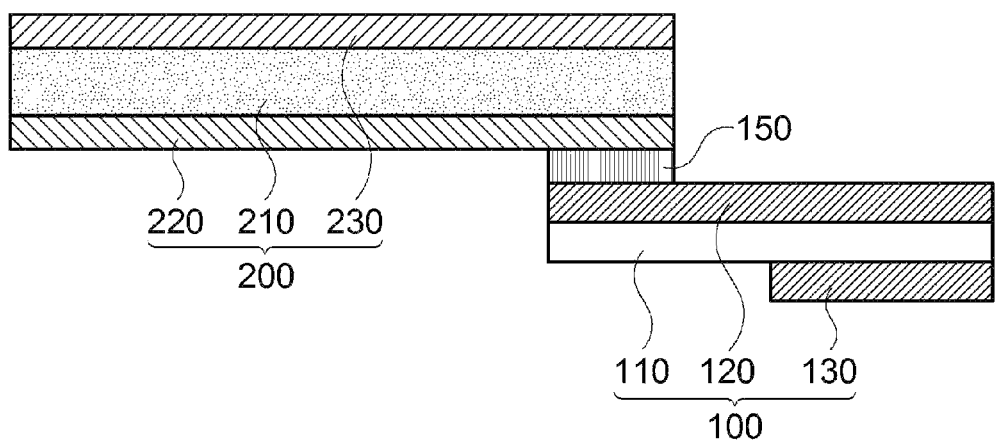
FIG. 2 is a schematic cross-sectional view illustrating the antenna package according to an embodiment.

FIG. 1 is a schematic plan view illustrating an antenna package according to an embodiment, and FIG. 2 is a schematic cross-sectional view illustrating the antenna package according to an embodiment.

Referring to FIGS. 1 and 2, the antenna package according to an embodiment may include an antenna element 100 and a circuit board 200.

The antenna element 100 may include an antenna dielectric layer 110 and an antenna unit 120.

The antenna dielectric layer 110 may include an insulation material having a predetermined dielectric constant. According to an embodiment, the antenna dielectric layer 110 may include an inorganic insulation material such as glass, silicon oxide, silicon nitride, or metal oxide, or an organic insulation material such as an epoxy resin, an acrylic resin, or an imide resin. The antenna dielectric layer 110 may function as a film substrate of the antenna element 100 on which the antenna unit 120 is formed.

According to an embodiment, the antenna dielectric layer 110 may include a polyester resin such as polyethylene terephthalate, polyethylene isophthalate, polyethylene naphthalate, polybutylene terephthalate, etc.; a cellulose resin such as diacetyl cellulose, triacetyl cellulose, etc.; a polycarbonate resin; an acrylic resin such as polymethyl (meth)acrylate, polyethyl (meth)acrylate, etc.; a styrene resin such as polystyrene, acrylonitrile-styrene copolymer, etc.; a polyolefin resin such as polyethylene, polypropylene, cyclic polyolefin or polyolefin having a norbomene structure, ethylene-propylene copolymer, etc.; a vinyl chloride resin; an amide resin such as nylon, aromatic polyamide; an imide resin; a polyether sulfonic resin; a sulfonic resin; a polyether ether ketone resin; a polyphenylene sulfide resin; a vinylalcohol resin; a vinylidene chloride resin; a vinylbutyral resin; an allylate resin; a polyoxymethylene resin; a thermoplastic resin such as an epoxy resin and the like. These compounds may be used alone or in combination of two or more thereof. In addition, a transparent film made of a thermosetting resin or an ultraviolet curable resin such as (meth)acrylate, urethane, acrylic urethane, epoxy, silicone, and the like may be used as the antenna dielectric layer 110.

According to an embodiment, the antenna dielectric layer 110 may include an adhesive film such as an optically clear adhesive (OCA), an optically clear resin (OCR) and the like.

According to an embodiment, the antenna dielectric layer 110 may be formed in a substantial single layer, or may be formed in a multilayer structure of two or more layers.

Capacitance or inductance may be generated by the antenna dielectric layer 110, thus to adjust a frequency band which can be driven or sensed by the antenna element 100. When the dielectric constant of the antenna dielectric layer 110 exceeds about 12, a driving frequency is excessively reduced, such that driving of the antenna in a desired high frequency band may not be implemented. Therefore, according to an embodiment, the dielectric constant of the antenna dielectric layer 110 may be adjusted in a range of about 1.5 to 12, and preferably about 2 to 12.

The antenna unit 120 may be formed on an upper surface of the antenna dielectric layer 110. For example, a plurality of antenna units 120 may be linearly or non-linearly arranged on the upper surface of the antenna dielectric layer 110 to form an array antenna.

The antenna unit 120 may include silver (Ag), gold (Au), copper (Cu), aluminum (Al), platinum (Pt), palladium (Pd), chromium (Cr), titanium (Ti), tungsten (W), niobium (Nb), tantalum (Ta), vanadium (V), iron (Fe), manganese (Mn), cobalt (Co), nickel (Ni), zinc (Zn), tin (Sn), molybdenum (Mo), calcium (Ca), or an alloy including at least one thereof. These may be used alone or in combination of two or more thereof. For example, the antenna unit 120 may include silver (Ag) or a silver alloy (e.g., a silver-palladium-copper (APC) alloy) to implement a low resistance. As another example, the antenna unit 120 may include copper (Cu) or a copper alloy (e.g., a copper-calcium (CuCa) alloy) in consideration of low resistance and fine line width patterning.

According to an embodiment, the antenna unit 120 may include a transparent conductive oxide such as indium tin oxide (ITO), indium zinc oxide (IZO), indium zinc tin oxide (IZTO), zinc oxide (ZnOx), or copper oxide (CuO).

According to an embodiment, the antenna unit 120 may include a lamination structure of a transparent conductive oxide layer and metal layer, for example, may have a two-layer structure of transparent conductive oxide layer-metal layer or a three-layer structure of transparent conductive oxide layer-metal layer-transparent conductive oxide. In this case, resistance may be reduced to improve signal transmission speed while improving flexible properties by the metal layer, and corrosion resistance and transparency may be improved by the transparent conductive oxide layer.

According to an exemplary embodiment, the antenna unit 120 may include a blackening processing part. Accordingly, reflectance on a surface of the antenna unit 120 may be decreased, thereby reducing the pattern from being viewed due to light reflection.

According to an embodiment, the surface of the metal layer included in the antenna unit 120 is converted into metal oxide or metal sulfide to form a blackened layer. According to an embodiment, the blackened layer such as a black material coating layer or a plating layer may be formed on the antenna unit 120 or the metal layer. Herein, the black material coating layer or plating layer may include silicon, carbon, copper, molybdenum, tin, chromium, nickel, cobalt, or oxide, sulfide, or an alloy containing at least one of them.

The composition and thickness of the blackened layer may be adjusted in consideration of an effect of reducing reflectance.

The antenna unit 120 may include a radiator 122 and a transmission line 124.

The radiator 122 may be formed in a mesh structure. Thereby, transmittance of the radiator 122 may be increased, and flexibility of the antenna element 100 may be improved. Therefore, the antenna element 100 may be effectively applied to a flexible display device.

A size of the radiator 122 may be determined depending on a desired resonance frequency, radiation resistance, and gain. For example, the antenna unit 120 or the radiator 122 may be implemented so as to transmit and receive signals in a resonance frequency band capable of performing high frequency or ultra high frequency (e.g., 3G, 4G, 5G or more) mobile communication, Wi-Fi, Bluetooth, near field communication (NFC), global positioning system (GPS) and the like.

As shown in FIG. 1, the radiator 122 may be implemented in a rectangular shape. However, this is only an example and there is no particular limitation on the shape of the radiator 122. That is, the radiator 122 may be implemented in various shapes such as a rhombus, circle and the like.

The transmission line 124 may be formed by extending from the radiator 122.

According to an embodiment, the transmission line 124 may be formed as a substantial single member by integrally connecting with the radiator 122, or may be formed as a separate member from the radiator 122.

According to an embodiment, the transmission line 124 may be formed in a mesh structure having substantially the same shape (e.g., having the same line width, the same interval, etc.) as the radiator 122, but it is not limited thereto, and may be formed in a mesh structure having substantially different shape from the radiator 122.

The antenna unit 120 may further include a signal pad 126.

The signal pad 126 may be connected to an end of the transmission line 124, thus to be electrically connected to the radiator 122 through the transmission line 124. According to an embodiment, the signal pad 126 may be integrally connected with the transmission line 124 to be formed as a substantially single member, or may be formed as a separate member from the transmission line 124. For example, the signal pad 126 may be formed as a member substantially integral with the transmission line 124, and the end portion of the transmission line 124 may be provided as the signal pad 126.

According to an embodiment, a ground pad 128 may be disposed around the signal pad 126. For example, a pair of ground pads 128 may be disposed to face each other with the signal pad 126 interposed therebetween. The ground pads 128 may be disposed around the signal pad 126 so as to be electrically and physically separated from the signal pad 126 and the transmission line 124.

According to an embodiment, the signal pad 126 and the ground pad 128 may be formed in a solid structure made of the above-described metals or alloy in consideration of a reduction in power supply resistance and noise absorption efficiency.

Meanwhile, according to an embodiment, a dummy pattern (not illustrated) may be formed around the radiator 122 and the transmission line 124. The dummy pattern may include the same metal as that of the radiator 122 and/or the transmission line 124, and may be formed in a mesh structure having a shape which is the same as or different from the radiator 122 and/or the transmission line 124.

In addition, according to an embodiment, the antenna element 100 may further include an antenna ground layer 130 formed on a lower surface of the antenna dielectric layer 110. The antenna ground layer 130 may include the above-described metals or alloy. Since the antenna element 100 includes the antenna ground layer 130, vertical radiation characteristics may be implemented.

The antenna ground layer 130 may be at least partially overlapped with the antenna unit 120. For example, the antenna ground layer 130 may be entirely overlapped with the radiator 122, but may not be overlapped with the transmission line 124, the signal pad 126 and the ground pad 128. As another example, the antenna ground layer 130 may be entirely overlapped with the radiator 122 and the transmission line 124, but may not be overlapped with the signal pad 126 and the ground pad 128. Further, as another example, the antenna ground layer 130 may be entirely overlapped with the radiator 122, the transmission line 124, the signal pad 126 and the ground pad 128.

According to an embodiment, a conductive member of the display device or a display panel on which the antenna package is mounted may be provided as the antenna ground layer 130. For example, the conductive member may include electrodes or wirings such as a gate electrode, source/drain electrodes, pixel electrode, common electrode, data line, scan line, etc. of a thin film transistor (TFT) included in the display panel, and a stainless steel (SUS) plate, heat radiation sheet, digitizer, electromagnetic shielding layer, pressure sensor, fingerprint sensor, etc. of the display device.

The circuit board 200 may include a core layer 210 and antenna power supply wirings 220. According to an embodiment, the circuit board 200 may be a flexible printed circuit board (FPCB).

The core layer 210 may include, for example, a flexible resin such as a polyimide resin, modified polyimide (MPI), epoxy resin, polyester, cycloolefin polymer (COP), liquid crystal polymer (LCP) and the like. The core layer 210 may include an internal insulation layer included in the circuit board 200.

The core layer 210 may include a first region 210a and a second region 210b. The first region 210a may include an antenna region 211 to which the antenna element 100 is connected, and the second region 210b may include an antenna driving unit region 212 to which an antenna driving unit 300 is connected. The pads 126 and 128 of the antenna element 100 are bonded to the core layer 210 through the antenna region 211, such that the antenna unit 120 may be connected to the antenna power supply wiring 220. In addition, as shown in FIG. 1, the antenna driving unit 300 is mounted on the core layer 210 through the antenna driving unit region 212, such that the antenna driving unit 300 may be connected to the antenna power supply wiring 220. Thereby, a power and a driving signal may be applied to the antenna unit 120 via the antenna power supply wiring 220 by the antenna driving unit 300.

Meanwhile, according to an embodiment, unlike FIG. 1, a connector for connecting the circuit board 200 and another circuit board, on which the antenna driving unit 300 is mounted, may be mounted in the antenna driving unit region 212. In this case, the antenna power supply wiring 220 and the antenna driving unit 300 mounted on the another circuit board may be connected through the connector.

In addition, according to an embodiment, the antenna driving unit region 212 may be formed in a form (e.g., a flexible flat cable (FFC) or FFC connector (such as a zero insertion force (ZIF) type and a Non-ZIF type connector)) capable of being fastened to the connector of the another circuit board on which the antenna driving unit is mounted without mounting the antenna driving unit 300 and the connector.

According to an embodiment, the first region 210a and the second region 210b may have widths different from each other. For example, the first region 210a may have a relatively wider width than the second region 210b, such that sufficient bonding stability with the antenna element 100 may be secured through the first region 210a having the relatively wide width. In addition, flexibility and circuit connection characteristics of the antenna package may be improved through the second region 210b having a relatively narrow width. For example, the circuit board 200 may be folded at a boundary portion between the first region 210a and the second region 210b, such that the antenna element 100 and the first region 210a may be disposed on a front portion of the display device, and the antenna driving unit 300 and the second region 210b may be disposed on a side portion or a rear portion of the display device.

The antenna power supply wirings 220 may be disposed on one surface of the core layer 210. For example, the circuit board 200 may further include a coverlay film formed on one surface of the core layer 210 to cover the antenna power supply wirings 220. In this case, by cutting or removing a portion of the coverlay film of the circuit board 200, one end of each of the antenna power supply wirings 220 may be exposed, and the exposed one end of each of the antenna power supply wirings 220 may be adhered to the signal pad 126. For example, a conductive intermediate structure 150 such as an anisotropic conductive film (ACF) is attached to the signal pads 126 and the ground pads 128, and then the exposed one end of each of the antenna power supply wirings 220 may be disposed on the conductive intermediate structure 150. Thereafter, the antenna region 211 of the circuit board 200 may be attached to the antenna element 100 through a heat treatment/pressing process, and each of the antenna power supply wirings 220 may be electrically connected to each signal pad 126. In addition, as the ground pads 128 are arranged around the signal pad 126, adhesion with the anisotropic conductive film (ACF) may be increased, and bonding stability may be improved.

Each of the antenna power supply wirings 220 may be individually and independently connected to each antenna unit 120. Thereby, power supply/driving control may be independently performed for each of the antenna units 120. For example, different phase signals may be applied to each antenna unit 120 through the antenna power supply wirings 220 respectively connected to the antenna units 120.

The antenna power supply wirings 220 may be formed over the first region 210a and the second region 210b. For example, the antenna power supply wirings 220 may be formed by extending from the antenna region 211 toward the antenna driving unit region 212.

The antenna power supply wirings 220 may be formed to have substantially the same length as each other. Herein, the substantially same length may include not only the case where the lengths are exactly the same as each other, but also the case where the lengths are not exactly the same as each other due to problems in the process, but satisfy a predetermined condition. In this case, the predetermined condition may include a condition in which a gain deviation of the antenna units 120 connected to the antenna power supply wirings 220 is below 1 dBi and/or a condition in which a phase delay difference of the antenna power supply wirings 220 is below 10 degrees.

The antenna power supply wirings 220 may be bent one or more times in the first region 210a. Thereby, the antenna power supply wirings 220 having substantially the same length may be disposed in the limited region. For example, the antenna power supply wirings 220 may include one or more first portions 220a extending in a first direction (e.g., a y-direction in FIG. 1) in the first region 210a, one or more second portions 220b extending in a first direction (e.g., an x-direction in FIG. 1) in the first region 210a, and one or more third portions 220c extending in the first direction (e.g., the y-direction in FIG. 1) in the second region 210b.

According to one embodiment, an interval a between the neighboring second portions 220b of the antenna power supply wirings 220 is 0.5 times or more and 3 times or less of an interval b between the neighboring third portions 220c of the antenna power supply wirings 220. In this case, the interval b between the neighboring third portions 220c of the antenna power supply wirings 220 may be 0.05 mm or more and 1 mm or less, and preferably 0.1 mm or more and 0.7 mm or less. By forming the interval a between the neighboring second portions 220b of the antenna power supply wirings 220 to be 0.5 times or more and 3 times or less of the interval b between the neighboring third portions 220c of the antenna power supply wirings 220, independence of electrical signals applied to each antenna unit 120 may be maintained, such that signal disturbance between the antenna power supply wirings 220 may be prevented, and a length of the first region 210a in the first direction (e.g., the y-direction in FIG. 1) may be reduced. Thereby, it is possible to dispose the first region 210a on the light-shielding part or the bezel part of the display device even if the light-shielding part or the bezel part formed on the front portion of the display device has a small area.

According to an embodiment, a ground layer 230 may be disposed on the other surface of the core layer 210.

The ground layer 230 may be overlapped with the antenna power supply wirings 220. Noise and signal interference around the antenna power supply wirings 220 may be absorbed or shielded through the ground layer 230. In addition, a generation of an electric field from the antenna power supply wirings 220 may be facilitated by the ground layer 230, thus to improve signal transmission efficiency.

Meanwhile, according to an embodiment, the above-described antenna power supply wirings 220 and the ground layer 230 may include the above-described metals or alloy.

Figure 3:
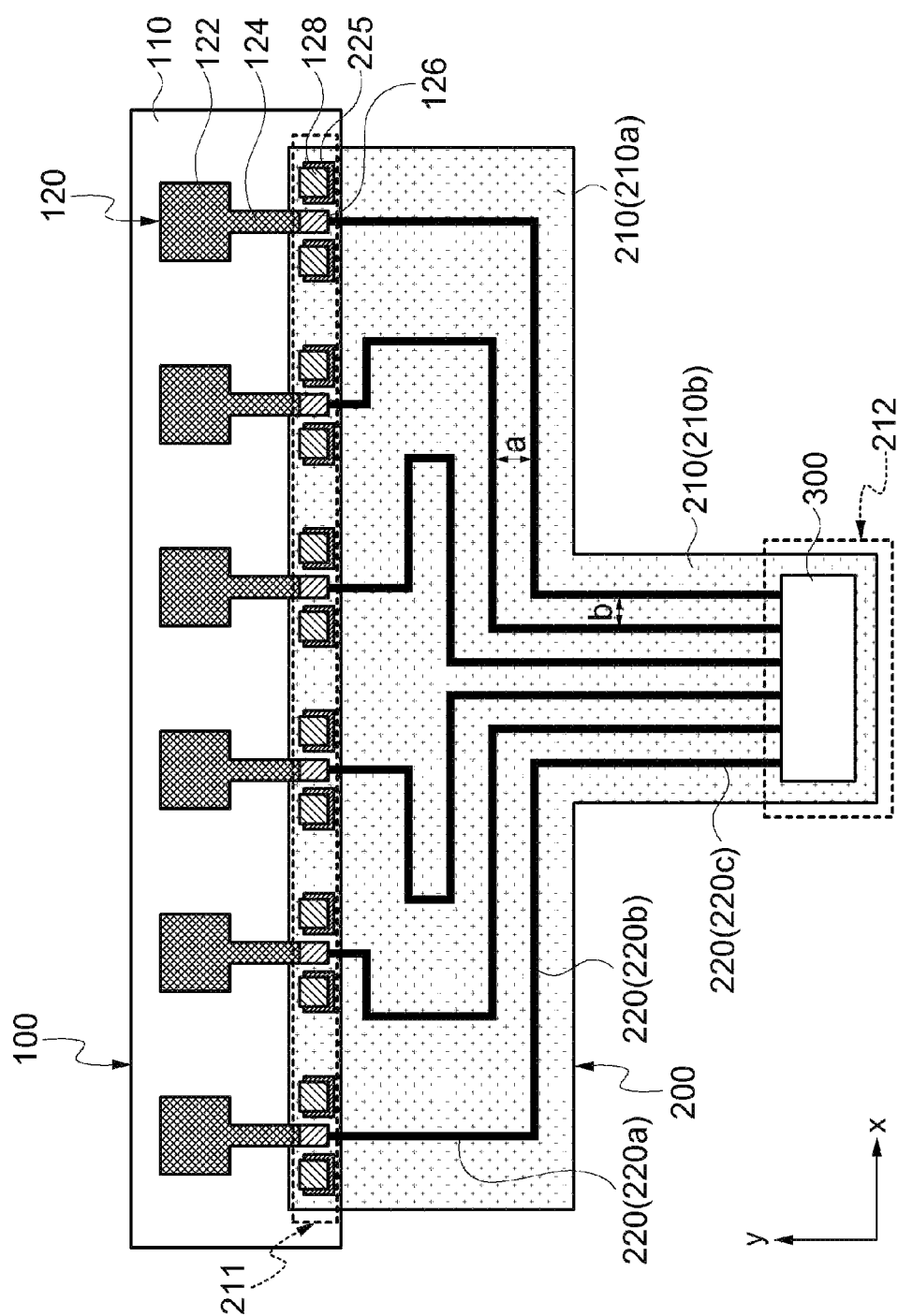
FIG. 3 is a schematic plan view illustrating an antenna package according to another embodiment.

FIG. 3 is a schematic plan view illustrating an antenna package according to another embodiment. Referring to FIG. 3, a circuit board 200 may include bonding pads 225 formed around an antenna power supply wiring 220. The bonding pad 225 may be included in an antenna region 211 of the circuit board 200.

The bonding pad 225 may be formed on one surface of a core layer 210 together with the antenna power supply wiring 220. For example, a pair of bonding pads 225 may be disposed with one antenna power supply wiring 220 interposed therebetween.

The bonding pad 225 is electrically and physically separated from the antenna power supply wiring 220, and may be adhered to a ground pad 128 of an antenna element 100 through a conductive intermediate structure 150 (see FIG. 2). As the bonding pad 225 is included in the antenna region 211 of the circuit board 200, bonding stability between the antenna element 100 and the circuit board 200 may be further improved.

Figure 4:
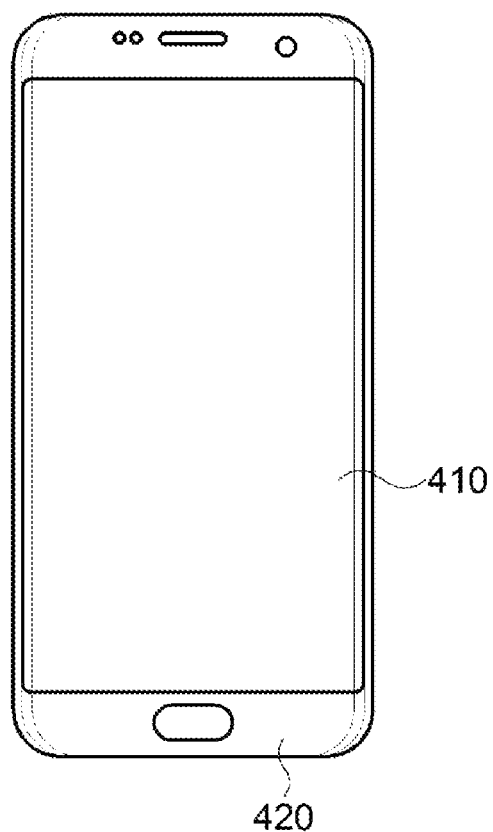
FIG. 4 is a schematic plan view illustrating a display device according to an embodiment.

FIG. 4 is a schematic plan view illustrating a display device according to an embodiment. More specifically, FIG. 4 is a view illustrating a front portion or a window surface of the display device.

Referring to FIG. 4, a display device 400 may include a display region 410 and a peripheral region 420 which are formed on the front portion thereof. The display region 410 may indicate a region in which visual information is displayed, and the peripheral region 420 may indicate an opaque region disposed on both sides and/or both ends of the display region 410. For example, the peripheral region 420 may correspond to the light-shielding part or the bezel part of the display device 400.

The above-described antenna element 100 may be disposed toward the front portion of the display device 400, for example, may be disposed on the display panel. In an embodiment, the radiator 122 and/or the transmission line 124 may be at least partially overlapped with the display region 410.

In this case, the radiator 122 and/or the transmission line 124 may be formed in a mesh structure, and a decrease in transmittance due to the radiator 122 and/or the transmission line 124 may be prevented.

The circuit board 200 may be disposed in the peripheral region 420 to prevent a deterioration of image quality in the display region 410. According to an embodiment, the circuit board 200 may be folded at the boundary portion between the first region 210a and the second region 210b, such that the first region 210a is disposed in the peripheral region 420 of the display device, and the antenna driving unit 300 and the second region 210b may be disposed on the side portion or the rear portion of the display device.

As described above, by forming the interval of the antenna power supply wirings 220 in first direction in the first region 210a below a predetermined multiple of the interval thereof in the second direction in the second region 210b, it is possible to prevent signal disturbance between the antenna power supply wirings 220 by maintaining the independence of the electrical signals applied to each antenna unit 120, and reduce the length of the first region 210a in the first direction. Thereby, it is possible to dispose the first region 210a on the light-shielding part or the bezel part of the display device even if the light-shielding part or the bezel part formed on the front portion of the display device has a small area.

The present invention has been described with reference to the preferred embodiments above, and it will be understood by those skilled in the art that various modifications may be made within the scope without departing from essential characteristics of the present invention. Accordingly, it should be interpreted that the scope of the present invention is not limited to the above-described embodiments, and other various embodiments within the scope equivalent to those described in the claims are included within the present invention.

[Experimental Example: Evaluation of Signal Transmission Rate of Antenna Power Supply Wirings According to a Ratio of the Interval a Between the Neighboring Second Portions of the Antenna Power Supply Wirings and the Interval b Between the Neighboring Third Portions of the Antenna Power Supply Wirings]

An antenna package having the same shape as shown in FIG. 1 was formed. Signal transmission rates of the antenna power supply wirings were evaluated by changing the ratio of the interval a between the neighboring second portions 220b of the antenna power supply wirings 220 to the interval b between the neighboring third portions 220c of the antenna power supply wirings 220 as listed in Table 1 below.

TABLE 1

| | Interval a (mm) between neighboring second portions of antenna power supply wirings | Interval b (mm) between neighboring third portions of antenna power supply wirings | Interval ratio a/b | Signal transmission rate of antenna power supply wirings (%) |
| --- | --- | --- | --- | --- |
| Comparative Example 1 | 0.09 | 0.45 | 0.2 | 33.85 |
| Example 1 | 0.225 | 0.45 | 0.5 | 40.98 |
| Example 2 | 0.45 | 0.45 | 1 | 41.74 |
| Example 3 | 0.525 | 0.35 | 1.5 | 43.44 |
| Example 4 | 0.5 | 0.25 | 2 | 45.15 |
| Example 5 | 1.125 | 0.45 | 2.5 | 46.24 |
| Example 6 | 1.35 | 0.45 | 3 | 43.15 |
| Comparative Example 2 | 1.575 | 0.45 | 3.5 | 34.75 |

Referring to Table 1, it can be confirmed that, unlike the comparative examples in which the ratio of the interval a between the neighboring second portions 220b of the antenna power supply wirings 220 to the interval b between the neighboring third portions 220c of the antenna power supply wirings 220 is 0.2 and 3.5, in the case of examples in which the ratio thereof is 0.5 to 3, the signal transmission rate in the antenna power supply wirings is excellent.

What is claimed is:

1. A circuit board comprising: a core layer which comprises a first region and a second region; and antenna power supply wirings disposed on the core layer over the first region and the second region, the antenna power supply wirings comprising a first portion extending in a first direction in the first region, a second portion extending in a second direction in the first region, and a third portion extending in the first direction in the second region, wherein an interval between the neighboring second portions of the antenna power supply wirings is 3 times or less of an interval between the neighboring third portions of the antenna power supply wirings, wherein the first region comprises an antenna region to which antenna units and the antenna power supply wirings are connected, and the second region comprises an antenna driving unit region to which an antenna driving unit and the antenna power supply wirings are connected.

2. The circuit board according to claim 1, wherein the interval between the neighboring second portions of the antenna power supply wirings is 0.5 times or more of the interval between the neighboring third portions of the antenna power supply wirings.

3. The circuit board according to claim 1, wherein the interval between the neighboring third portions of the antenna power supply wirings is 0.05 mm or more and 1 mm or less.

4. The circuit board according to claim 1, wherein the interval between the neighboring third portions of the antenna power supply wirings is 0.1 mm or more and 0.7 mm or less.

5. The circuit board according to claim 1, wherein the antenna power supply wirings are formed to have substantially the same length as each other.

6. The circuit board according to claim 5, wherein the antenna power supply wirings are formed so that a gain deviation of antenna units connected to the antenna power supply wirings is below 1 dBi or a phase delay difference of the antenna power supply wirings is below 10 degrees.

7. An antenna package comprising:
   the circuit board according to claim 1; and
   antenna units connected to the antenna power supply wirings of the circuit board.

8. A display device comprising the antenna package according to claim 7.

\* \* \* \* \*